United States Patent
Sabripour

(10) Patent No.: US 6,704,248 B1
(45) Date of Patent: Mar. 9, 2004

(54) HIGH DENSITY POWER MODULE INCORPORATING PASSIVE COMPONENTS DISTRIBUTED IN A SUBSTRATE

(75) Inventor: Shabriar Shey Sabripour, Cranbury, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 185 days.

(21) Appl. No.: 09/864,452

(22) Filed: May 25, 2001

(51) Int. Cl.⁷ ................................................ H05K 1/18
(52) U.S. Cl. ................. 367/763; 361/748; 361/735; 361/790; 361/736; 361/760; 174/255; 336/200; 336/232
(58) Field of Search ................. 361/763, 735, 361/790, 748, 736, 760, 761; 333/246, 247, 185; 174/255; 336/200, 232

(56) References Cited

U.S. PATENT DOCUMENTS

| | | | | |
|---|---|---|---|---|
| 5,479,141 A | * | 12/1995 | Ishizaki et al. | 333/204 |
| 5,495,387 A | * | 2/1996 | Mandai et al. | 361/328 |
| 5,745,981 A | | 5/1998 | Roshen et al. | |
| 5,959,846 A | * | 9/1999 | Noguchi et al. | 361/782 |
| 6,133,809 A | * | 10/2000 | Tomohiro et al. | 333/184 |
| 6,147,573 A | * | 11/2000 | Kumagai et al. | 333/185 |
| 6,160,461 A | * | 12/2000 | Azuma et al. | 333/172 |
| 6,222,427 B1 | * | 4/2001 | Kato et al. | 333/185 |
| 6,301,114 B1 | * | 10/2001 | Ootani | 361/704 |

* cited by examiner

Primary Examiner—David Martin
Assistant Examiner—Thanh Y. Tran
(74) Attorney, Agent, or Firm—Swidler Berlin Shereff Friedman, LLP

(57) ABSTRACT

The present invention is directed towards a multilayered circuit module and a method for constructing such a module, wherein the module has passive components such as capacitors, inductors, transformers distributed into a ceramic substrate. This module provides an optimally close packing density of these components without wasting large areas of unused substrate. The module of the present invention weaves capacitors, inductors, and transformers into the substrate without the use of printed circuit boards and eliminating discrete components. The substrate of the module becomes a functional component itself, rather than just a block receptacle for discrete components. The module of the present invention provides a very densely packed power supply with good heat conduction properties and which is also less costly to build than HDI modules.

18 Claims, 3 Drawing Sheets

HIGH DENSITY POWER MODULE INCORPORATING PASSIVE COMPONENTS DISTRIBUTED IN A SUBSTRATE

BACKGROUND OF THE INVENTION

Building power supplies as small and as efficient as possible is very important for many applications such as satellite power supplies and other space applications. At a launch cost of $25–50K per pound, the savings can be as much a s $10M per spacecraft if for example, 200 pounds of weight is saved. Several new generations of technology have progressively developed which have made power supplies smaller and more efficient. Power supply size can be reduce by two methods: 1) by using advanced packaging methods or 2) by using high frequency topologies or both.

One of the earlier forms of higher density power supply packaging technology used "surface mount" technology. With surface mount technology, discrete components such as integrated circuits, resistors, capacitors, inductors and transformers are individually qualified and tested and then installed in a printed circuit (PC) board. Most of the discrete components are surface mounted and when surfae mount components are not available or not reliable enough for the environments of space, some are connected by through holes where they are connected through the PC board.

An improvement in packing density was obtained by the use of multichip module (MCM) technology. Multi-chip module technology involves using bare integrated circuit (IC) dies which are interconnected through multi-layered MCM packaging technologies such as Hybrids. This provides closer spacing of components.

One earlier form of multichip module technology used for creating power supplies is referred to as hybrid technology. Hybrid packaging involves using bare IC dies placed in close proximity to discrete components such as transformers and multi-layer capacitors. These parts are mounted on multi-layered substrtates which form the interconnections. The whole power supply package is then hermetically sealed. This hybrid package provides a higher packing density than the convention surface mount technology.

The next generation of multi-chip module technology that provides even better packing density and heat conduction properties is referred to as "High Density Interconnect" (HDI) technology. HDI technology allows bare integrated dies to be mounted inside a ceramic block which conducts heat down into the bottom of the package while the chips are interconnected on the top of the package. Since the interconnects are performed on top of the components, the unused space required for routing in a traditional hybrid technology is eliminated and a 2:1 packing density improvement over hybrids can be achieved. Furthermore, since the active devices are in a substrate a good thermal path can be provided to a baseplate.

To further improve and maximize the density of power supplies, the switching frequency of the power supplies must be increased to lower the size and volume requirement of the passive components such as the magnetics or the capacitors. This method has already been implemented with switching frequencies up to 1–2 MHz. Above this frequency two limitations occur. One is the availability of high efficiency magnetic core material at these frequencies and the other is the interconnection of these components to the rest of the power supply circuit. At higher freqencies parasitic elements such as trace inductances become dominant and interfere with the desired operation of the power supply.

What is needed is a packing technology that further improves upon HDI technology by providing even greater packing density to further reduce the parasitic elements while switching at 1–2 MHz range while increasing the power supply density without the need to go much higher in frequency. What is also needed is a packaging method that provides good heat conduction properties, power supply efficiency, is simple and inexpensive to build, and is effective for use in space applications.

SUMMARY OF THE INVENTION

The present invention is directed towards a multilayered circuit module and a method for constructing such a module, wherein the module has passive components such as capacitors, inductors, transformers distributed into a ceramic substrate. Since ferrite magnetics and mutilayer ceramics capacitors are the dominant volume drivers of a space power supply, this module provides an optimally close packing density of these components without wasting large areas of unused substrate. The module of the present invention weaves capacitors, inductors, and transformers into the substrate without the use of printed circuit boards and eliminating discrete components. The substrate of the module becomes a functional component itself, rather than just a block receptacle for discrete components. The module of the present invention provides a very densely packed power supply with good heat conduction properties and which is also less costly to build than HDI modules.

DETAILED DESCRIPTION OF THE INVENTION

Figure 1:
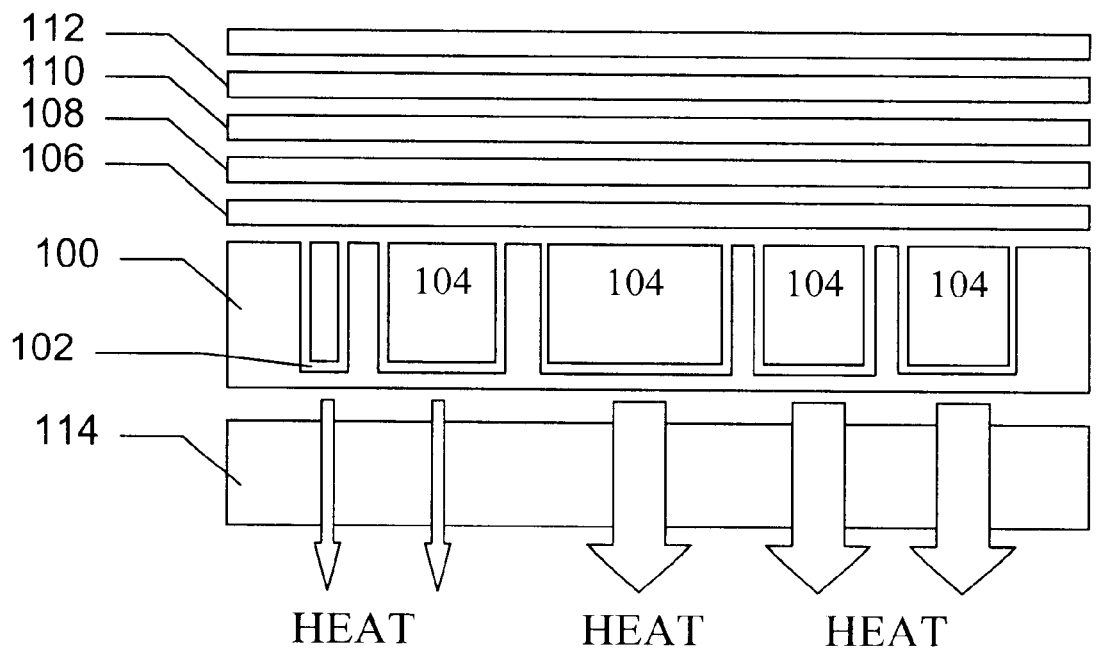
FIG. 1 depicts a block diagram illustrating an example of a High Density Interconnect (HDI) module.

An HDI is illustrated in FIG. 1. The process for forming an HDI module begins with a rectangular block of substrate 100 typically made out of a ceramic material such as alumina. Next, wells 102 are machined into substrate 100 such that the depth of the well 102 matches the thickness of a chip (bare die) 104 which will be placed in the well. In addition to chips, discrete components such as resistors, capacitors, inductors, and transformers can be mounted in the wells 102.

Chips 104 are situated such that the top surface of each chip 104 forms a coplanar surface, with the pads of the chips facing upward. The chips 104 are then interconnected as follows. First a layer of insulating material 106 such as kapton, a polyimid film, is laid over the chips, whose top surface is coplanar. Next, via holes are laser drilled in the layer of kapton so that the pads of the chips are exposed for later interconnection. If the chip is skewed, a vision system can automatically detect that the chip is skewed and automatically correct the laser drilling to account for the skew. Next, a very thin layer 108 of copper (roughly 15 microns) is sputtered on top of the kapton layer 106. A laser then etches away areas of unwanted copper so that all that remains is copper traces for interconnecting the components. The process is then repeated by placing another layer 110 of kapton over the copper. Via holes are again drilled and another layer 112 of copper is sputtered on top of this second kapton layer. Many layers of kapton and copper may be built up in this fashion. This forms a multilayer module with the interconnections on top of the module.

This HDI process allows the components to be placed very close together; ie. it provides a very high packing density. Hybrid technology, in comparison, requires that there be some space between components for running traces. This space is eliminated in the HDI module, because the interconnections are all made on the layers above the chips. HDI thus provides much greater packing density.

The HDI package also provides very good heat flow. Heat generated by the chips flows down through the ceramic substrate 100 as indicated by the arrows. This provides better heat flow than a hybrid design module where the heat has to travel through several layers of printed circuit boards. With the HDI package, the ceramic substrate can be mounted on a heat sink 114 so that the chips 104 are all connected on top and the heat flows out of the bottom of the substrate 100 into the heat sink 114. Heat flows down through ceramic substrate 100 by conduction very well. There is only about 40 mils of ceramic block underneath the wells 102.

This HDI configuration is especially useful in space. In space, there is no heat transfer by convection, just conduction and radiation. The heat generated by power components such as transformers, inductors, FETs, and so forth, must be transferred away from the power supply. The HDI package can be mounted on a chassis to conduct the heat down into the spacecraft. In contrast, the hybrid module has layers of printed circuit boards located beneath the chips, which act as a barrier to heat flow. The hybrid package thus requires cutting holes in the printed circuit boards or other methods to try to improve heat flow.

HDI technology can save a great deal of weight and cost. In a typical spacecraft, the use of HDI packages rather than hybrid packages could save about 90 pounds which translates into millions of dollars in savings. Additionally, the closeseness of components in the HDI design, improves circuit performance by reducing parasitic inductances which create waveform inaccuracies, losses and other undesirable effects. Parasitic inductances introduce noise in the system. High frequency noise spikes create power loss, and a corresponding poor efficiency. Power supply efficiency is very important in space applications because power is very limited. HDI modules provide a very clean output waveform which results in an efficient power supply.

As mentioned previously, in addition to integrate circuit chips 104, other discrete compononents such as inductors and capacitors can be mounted in wells 102. U.S. Pat. No. 5,745,981 to Roshen et al. discloses an example of a magnetic component such as a transformer which can be constructed in the well of an HDI module. The transformer is constructed into the well by building up alternating dielectric layers and metal winding layers on top of a magnetic plate.

The packing method of the present invention provides a method for even higher packing density than HDI. As shown in FIG. 1, there is still a lot of volume in ceramic substrate 102 that is unused. An ideal configuration would use the volume of the ceramic block 102 as efficiently as possible; i.e to pack components in as tight a volume as possible while still providing good heat conduction.

Figure 2A:
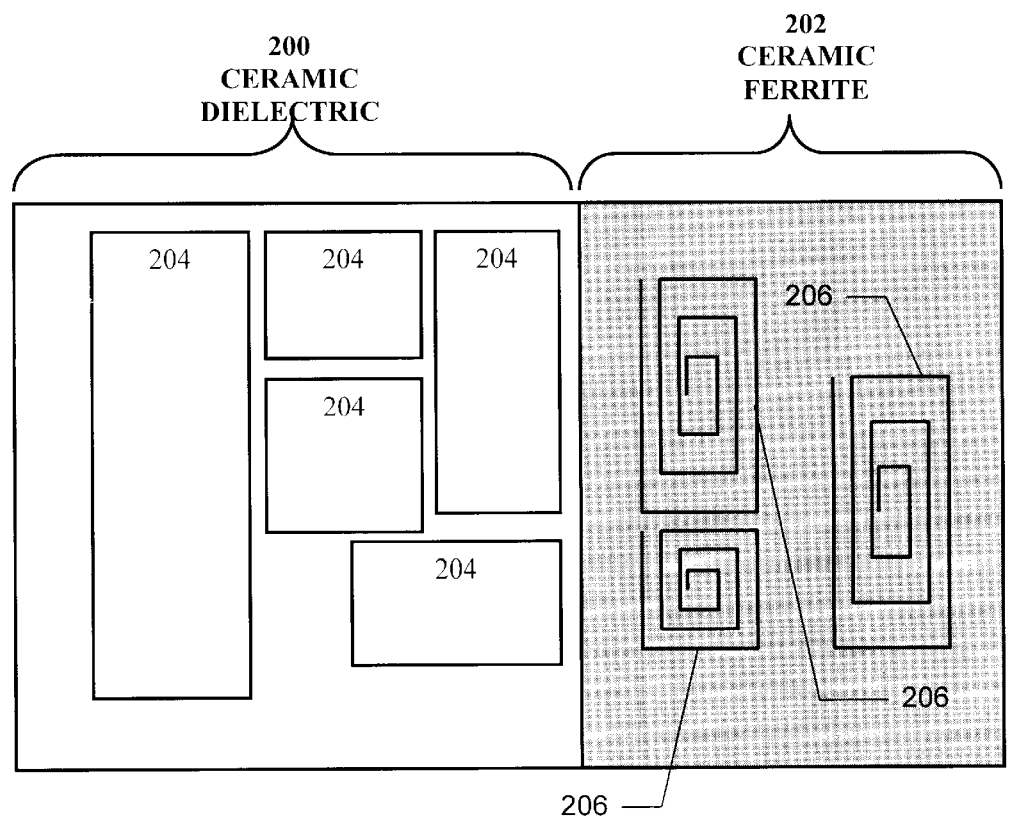
FIG. 2A depicts a block diagram illustrating a top view of a single layer of the module of the present invention.
Figure 2B:
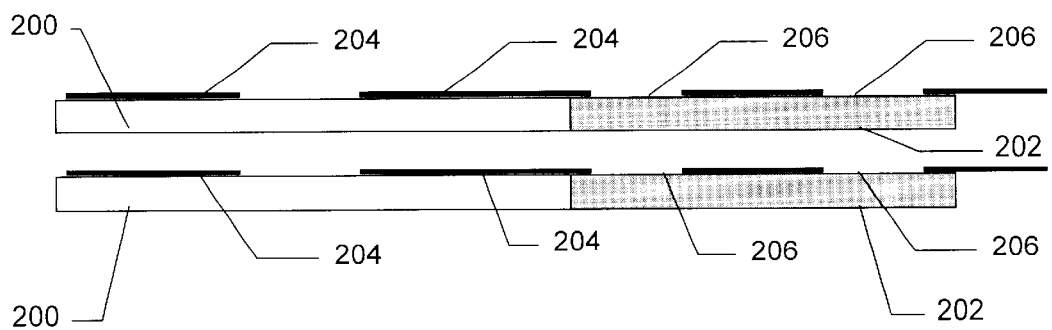
FIG. 2B depicts a block diagram illustrating a side view of two layers of the module of the present invention.

FIGS. 2A and 2B depict a diagram illustrating a first layer of a module of the present invention. FIG. 2A shows a view looking down from the top, while FIG. 2B shows a view from the side. First, a sheet 200 made of ceramic dielectric material used for making multi-layer capacitors, for example X7R, is layed out in its "green state." Green state is the state of the ceramic powder before it is fired. The ceramic powder in green state is soft and malleable. A sheet 202 of ceramic ferrite material is then placed next to the layer of ceramic dielectric. The dielectric sheet 200 and the ceramic sheet 202 together form the first layer of the package. Next, a layer of metallization 204 and 206 is patterned on top of the first substrate layer comprised of dielectric sheet 200 and the and ferrite sheet 202. The metallizations 204 in the dielectric portion of the substrate will form the plates of a capacitor whereas the metallizations 206 in the magnetic (ferrite) portion of the substrate will form the windings of a magnetic component such as an inductor or transformer.

Next, additional layers are built up as follows. A layer of ceramic dielectric is placed on top of the first dielectric layer 200. Similarly, another layer of ferrite is placed on top of the first ferrite layer 202. This forms the second layer of subtrate. Each substrate layer can have holes located where inter-layer connections are desired. Then, another metallization pattern is deposited upon each of these new substrate layers. This process continues as substrate layers are built up. The substrate layers are interleaved with layers of metallization patterns. Each substrate layer can have a dielectric portion and a ferrite portion.

Figure 3:
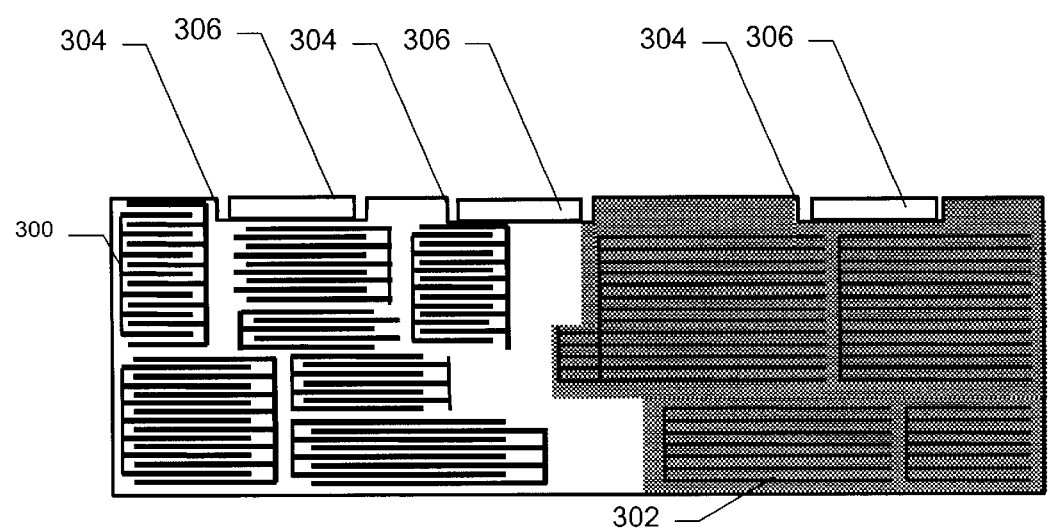
FIG. 3 illustrates a side view of a module of the present invention.

FIG. 3 illustrates the module at completion. The metallization patterns form components woven into the substrate. Multi-layered ceramic capacitors 300 are built up by patterning layers of metallizations in the dielectric portion. Multi-layered transformers 302 are built up by patterning windings in the ferrite/magnetic portion. A layer of a transformer can be formed by patterning a metal winding in the ferrite portion. Interconnections between components are made by patterning appropriate metal traces.

A single capacitor could have several hundred layers of ceramic and metallization layers interleaved. This capacitor configuration having a high number of plates is very useful because as the number of plates are increased, the capacitance increases, and the equivalent series resistance (ESR) decreases. Having a high ESR is undesirable because it makes the capacitor lossy and above a certain frequency it starts to act like an inductor. This capacitor configuration is also very volumetrically efficient.

In this manner, a power supply package is built up having multi-layer capacitors, inductors, and transformers distributed into the ceramic substrate. This provides an optimally close packing density of these components without wasting large areas of unused substrate. Many capacitors and inductors and transformers can be formed and distributed throughout the ceramic substrate. This builds up capacitors, inductors, and transformers without the use of printed circuit boards and without the use of discrete components. In this manner the substrate becomes a functional component itself, rather than just a block receptacle for discrete components. The package provides optimal packing density by weaving the capacitors, inductors, and transfomers and interconnections into the substrate itself.

As an option, wells 304 can also be built into the top of the substrate. The upper substrate layers have openings which form the wells. Discrete components such as integrated circuit chips can be placed in these wells, as with HDI packages. The wells 304 don't need to be very deep, because the bulkiest discrete components are woven into the substrate. The remaining discrete components, such as IC chips 306 are relatively thin. This manner of formation also allows the wells 304 to be built as the layers are put in place. Thus, the module is built without having to machine the well cavities and laser drill the via holes, which is a costly process. The laser drilling uses a diamond-carbide tip which is very expensive.

Once all of the layers have been put in place, the entire module can be fired at once. By building up the layers in the described manner, capacitors, inductors and transformers are distributed throughout the substrate. This provides a very densely packed power supply with good heat conduction properties which is also less costly to build than HDI modules.

What is claimed is:

1. A multilayered circuit module, comprising:
    a plurality of substrate layers, wherein each substrate layer includes a dielectric portion adjacent to a ferrite portion; and
    a first metallization pattern interwoven on the dielectric portion to form at least one capacitor and a second metallization pattern interwoven on the ferrite portion to form at least one inductor or transformer.

2. The multilayered circuit module of claim 1, wherein the plurality of substrate layers are ceramic.

3. The multilayered circuit module of claim 1, wherein the dielectric portion is put together with the ceramic in a green state before the ceramic is fired.

4. The multilayered circuit module of claim 1, wherein at least one of the substrate layers has openings for interlayer connections.

5. The multilayered circuit module of claim 1, wherein a substrate layer in the plurality of substrate layers has an opening to form a well, the well capable of receiving a discrete component.

6. The multilayered circuit module of claim 1, wherein the multilayered circuit module is mounted on a heat sink.

7. A multilayered circuit module, comprising:
    a plurality of dielectric sheets;
    a plurality of ferrite sheets, each ferrite sheet substantially adjacent to a corresponding dielectric sheet and in substantially the same plane as the corresponding dielectric sheet forming a substrate layer of the module;
    a plurality of metallization patterns interposed between each substrate layer of the module.

8. The multilayered circuit module of claim 7, wherein a capacitor is formed by the metallization patterns within the dielectric sheets.

9. The multilayered circuit module of claim 8, wherein a magnetic component is formed by the metallization patterns within the sheets.

10. The multilayered circuit module of claim 9, wherein the magnetic component is an inductor or a transformer.

11. A multilayered circuit module, comprising:
    a first substrate sheet, the sheet having a dielectric portion and a ferrite portion;
    a second substrate sheet having a dielectric portion and a ferrite portion; and
    a first metallization pattern interposed between the first substrate sheet on the dielectric portion and a second metallization pattern interposed between the first substrate on the ferrite portion and the second substrate sheet.

12. The multilayered circuit package of claim 11, further comprising:
    a plurality of additional substrate layers, each layer comprised of a dielectric portion and a ferrite portion; and
    a plurality of additional metallization pattern layers interposed between each additional substrate layer.

13. The multilayered circuit package of claim 12, wherein at least one capacitor is formed in the dielectric portion of the substrate sheets.

14. The multilayered circuit package of claim 12, wherein at least one inductor or transformer is formed in the dielectric portion of the substrate sheets.

15. A method of constructing a multilayered circuit module, comprising:
    preparing a first dielectric substrate sheet;
    placing a first ferrite substrate sheet next to the first dielectric sheet to form a first substrate layer;
    depositing a first metallization pattern on the first dielectric substrate sheet and a second metallization pattern on the first ferrite substrate sheet;
    placing a second dielectric substrate sheet on the first metallization pattern; and
    placing a second ferrite substrate sheet on the second ferrite substrate sheet.

16. The method of claim 15, further comprising:
    placing a plurality of additional substrate layers interposed with metallization pattern layers, each additional substrate layer having a dielectric portion and a magnetic portion.

17. The method of claim 16, wherein a capacitor is formed in the dielectric portion and an inductor is formed in the ferrite portion.

18. The method of claim 16, wherein a substrate layer has an opening for forming a well, the well capable of receiving a discrete component.

* * * * *

UNITED STATES PATENT AND TRADEMARK OFFICE
CERTIFICATE OF CORRECTION

PATENT NO. : 6,704,248 B1
DATED : March 9, 2004
INVENTOR(S) : S. Shey Sabripour

It is certified that error appears in the above-identified patent and that said Letters Patent is hereby corrected as shown below:

Title page,
Item [75], Inventor, "Shabriar Shey Sabripour" should read -- S. Shey Sabripour --.

Column 14,
Lines 25-26, "dielectric" should read -- ferrite --.

Signed and Sealed this

Twenty-seventh Day of July, 2004

JON W. DUDAS
*Acting Director of the United States Patent and Trademark Office*